(12) United States Patent
Moon

(10) Patent No.: US 7,947,972 B2
(45) Date of Patent: May 24, 2011

(54) LIGHT EMITTING DEVICE

(75) Inventor: Yong-Tae Moon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 182 days.

(21) Appl. No.: 12/416,487

(22) Filed: Apr. 1, 2009

(65) Prior Publication Data

US 2009/0250685 A1  Oct. 8, 2009

(30) Foreign Application Priority Data

Apr. 2, 2008  (KR) .................. 10-2008-0030966

(51) Int. Cl.
*H01L 29/06* (2006.01)
(52) U.S. Cl. .............. 257/13; 257/9; 257/14; 257/17; 257/19; 257/79; 257/98; 257/210; 257/296
(58) Field of Classification Search .................. None
See application file for complete search history.

(56) References Cited

U.S. PATENT DOCUMENTS

| 2005/0051766 A1* | 3/2005 | Stokes et al. .................... 257/17 |
| 2005/0276993 A1 | 12/2005 | Sohn et al. |
| 2006/0152147 A1 | 7/2006 | Lee et al. |
| 2009/0032836 A1 | 2/2009 | Huh et al. |

FOREIGN PATENT DOCUMENTS

| KR | 10-2005-0040958 A | 5/2005 |
| KR | 10-2006-0081190 A | 7/2006 |
| KR | 10-2006-0089971 A | 8/2006 |
| KR | 10-2006-0125253 A | 12/2006 |
| KR | 10-2007-0083377 A | 8/2007 |

OTHER PUBLICATIONS

Kwon et al., "Surface-Plasmon-Enhanced Light-Emitting Diodes", Advanced Materials, 2008, pp. 1253-1257, vol. 20.

\* cited by examiner

*Primary Examiner* — N Drew Richards
*Assistant Examiner* — Kyoung Lee
(74) *Attorney, Agent, or Firm* — Birch, Stewart, Kolasch & Birch, LLP

(57) ABSTRACT

Disclosed are a light emitting device. The light emitting device includes a first conductive semiconductor layer, a light emitting layer, a protective layer, a nano-layer and a second conductive semiconductor layer. The light emitting layer is formed on the first conductive semiconductor layer. The protective layer is formed on the light emitting layer. The nano-layer is formed on the protective layer. The second conductive semiconductor layer is formed on the nano-layer.

24 Claims, 2 Drawing Sheets

US 7,947,972 B2

LIGHT EMITTING DEVICE

The present application claims the benefit under 35 U.S.C. §119 of Korean Patent Application No. 10-2008-0030966, filed Apr. 2, 2008, which is hereby incorporated by reference in its entirety.

BACKGROUND

A light emitting device (LED) is a semiconductor device to convert a current into light. Since a red LED has been commercialized, the LED, together with a green LED, is used as a light source of electronic devices including information communication equipment.

In order to improve light emitting efficiency of the LED, the following two schemes have been suggested. One scheme is to increase the probability of combination of injected electrons and holes at a light emitting layer to improve internal quantum efficiency. The other scheme is to increase light extraction efficiency such that light generated in the light emitting layer can be effectively emitted to an exterior.

However, if a concave-convex pattern is formed on the interfacial surface of a hole injection layer for the purpose of increasing light extraction efficiency, the internal quantum efficiency can not be increased. Accordingly, it is necessary to provide a new scheme to improve the light extraction efficiency while improving the internal quantum efficiency.

BRIEF SUMMARY

The embodiment provides a light emitting device capable of improving internal quantum efficiency and light extraction efficiency and a method for manufacturing the same.

According to the embodiment, a light emitting device includes a first conductive semiconductor layer, a light emitting layer on the first conductive semiconductor layer, a protective layer on the light emitting layer, a nano-layer on the protective layer and a second conductive semiconductor layer on the nano-layer.

And according to the another embodiment, a light emitting device includes a first electrode layer, a first conductive semiconductor layer on the first electrode layer, a light emitting layer on the first conductive semiconductor layer, a protective layer on the light emitting layer, a nano-layer on the protective layer, a second conductive semiconductor layer on the nano-layer and a second electrode layer on second conductive semiconductor layer.

DETAILED DESCRIPTION OF THE EMBODIMENTS

Figure 1:
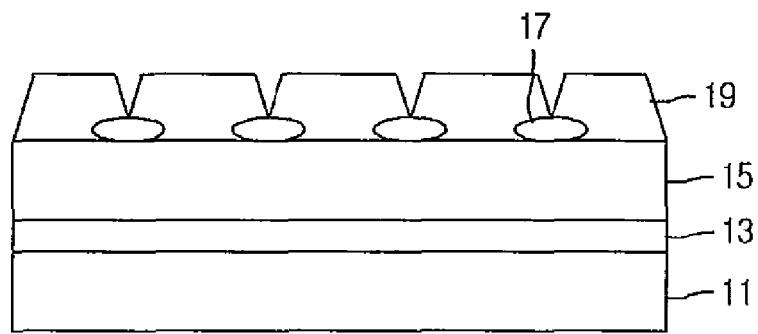
FIG. 1 is a sectional view showing a light emitting device according to a first embodiment.

Hereinafter, embodiments will be described in detail with reference to accompanying drawings.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers can also be present. Such a position of the layer has been described with reference to the drawings.

The thickness and size of each layer shown in the drawings can be exaggerated, omitted or schematically drawn for the purpose of convenience or clarity. In addition, the size of elements does not utterly reflect an actual size.

First Embodiment

FIG. 1 is a sectional view showing a light emitting device according to a first embodiment.

As shown in FIG. 1, the light emitting device according to the first embodiment can include a first conductive semiconductor layer 11, a light emitting layer 13, a protective layer 15, a nano-layer 17, and a second conductive semiconductor layer 19. The light emitting layer 13 can be formed on the first conductive semiconductor layer 11. The protective layer 15 can be formed on the light emitting layer 13. The nano-layer 17 can be formed on the protective layer 15. The second conductive semiconductor layer 19 can be formed on the nano-layer 17.

The first conductive semiconductor layer 11 can include an electron injection layer, and the second conductive semiconductor layer 19 can include a hole injection layer. In addition, the first conductive semiconductor layer 11 can include the hole injection layer, and the second conductive semiconductor layer 19 can include the electron injection layer. Hereinafter, the first conductive semiconductor layer 11 including the electron injection layer, and the second conductive semiconductor layer including the hole injection layer will be representatively described, but the embodiment are not limited thereto.

The first conductive semiconductor layer 11, the light emitting layer 13, and the second conductive semiconductor layer 19 can include a nitride semiconductor layer, but the embodiment is not limited thereto. The nitride semiconductor layer can include III-IV group nitride semiconductor layer. The light emitting layer 13 can have a single quantum well structure or a multi-quantum well structure.

The second conductive semiconductor layer 19 can have a concave-convex upper surface. Accordingly, light extraction efficiency can be improved when light generated in the light emitting layer 13 is extracted to an exterior.

The protective layer 15 can include at least one III-IV group nitride semiconductor layer including aluminum (Al). The nano-layer 17 can be patterned in a predetermined shape. The protective layer 15 formed below the nano-layer 17 is exposed in a region in which the nano-layer 17 is not formed. Accordingly, the second conductive semiconductor layer 19 formed in the subsequent process can be formed in contact with the protective layer 15.

The nano-layer 17 can include at least one of metals that easily emit electrons upon the external stimulus and have a negative dielectric constant.

For example, the nano-layer 17 can include at least one of the group consisting of a single metal having conductive electrons, a metal alloy including the single metal, and a metal nitride including the single metal. The nano-layer 17 can include at least one of one single metal selected from the group consisting of platinum (Pt), palladium (Pd), chromium (Cr), nickel (Ni), titanium (Ti), tantalum (Ta), tungsten (W), aluminum (Al), silver (Ag), gold (Au), copper (Cu), gallium (Ga), indium (In), iron (Fe), zinc (Zn), tin (Sn), cobalt (Co), ruthenium (Ru), zirconium (Zr), vanadium (V), hafnium (Hf), and molybdenum (Mo), a metal alloy including the selected single metal, and a metal nitride including the single metal.

According to the embodiment, the surficial shape of the second conductive semiconductor layer 19 can be adjusted by using a nano-mask serving as a nano-layer. Accordingly, the embodiment can provide the light emitting device representing low resistance by using the nano-mask electrically having conductivity.

In addition, according to the embodiment, the interaction between surface plasmons of the nano-mask and excitons of the light emitting layer 13 remarkably improves internal quantum efficiency.

Therefore, the light emitting device and the method for manufacturing the same according to the embodiment can effectively solve problems related to conventional shape control technologies for a GaN thin film, and increase light extraction efficiency while increasing internal quantum efficiency to maximize external quantum efficiency of optical elements, so that a GaN light emitting device having a high intensity can be provided.

Second Embodiment

Figure 2:
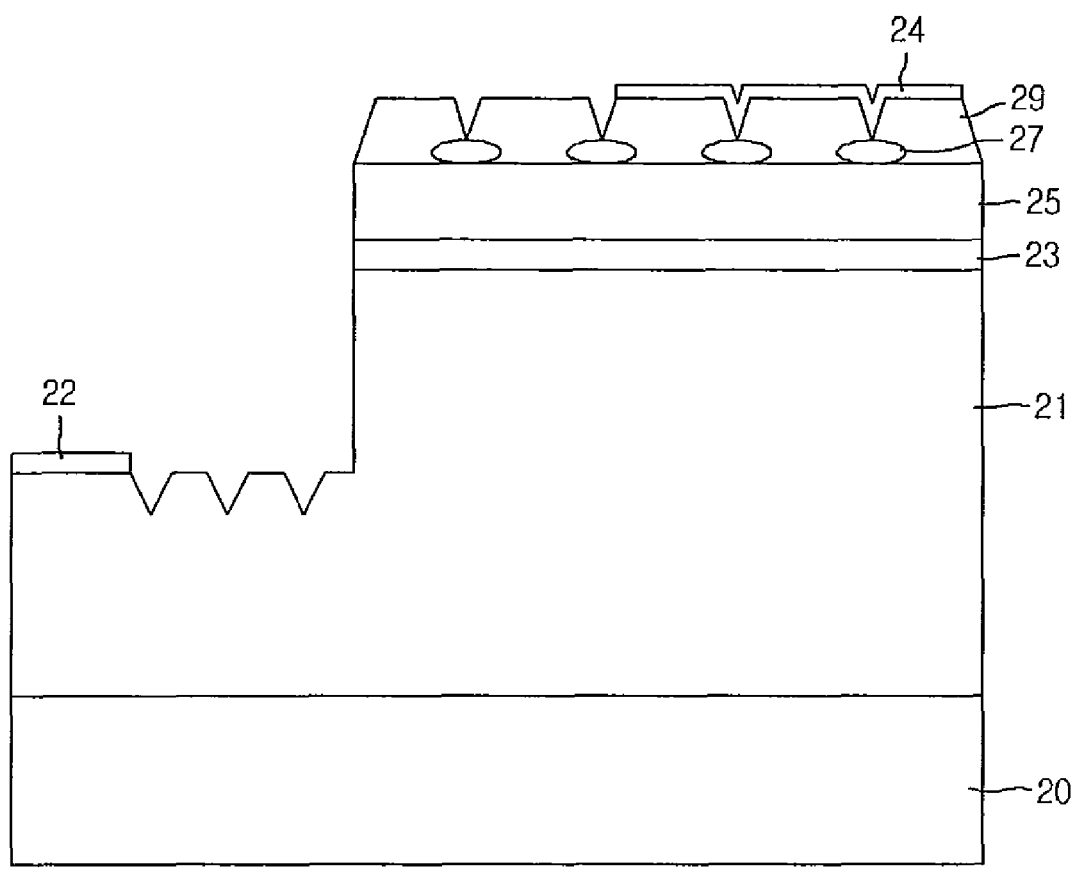
FIG. 2 is a sectional view showing a light emitting device according to a second embodiment.

FIG. 2 is a sectional view showing a light emitting device according to the second embodiment. Particularly, FIG. 2 is a sectional view showing a horizontal light emitting device according to the second embodiment, but the embodiment is not limited thereto. Hereinafter, the structure of the light emitting device and a method for manufacturing the light emitting device according to the second embodiment will be described with reference to FIG. 2.

A first conductive semiconductor layer 21 can be formed on a substrate 20. The first conductive semiconductor layer 21 can include an electron injection layer. The electron injection layer can include a high-quality thin film layer based on $Al_xIn_yGa_{1-x-y}N$ ($0 \leq x, y \leq 1$) and having electrical conductivity. When the substrate 20 is a hetero substrate, the substrate 20 can include silicon (Si), sapphire, silicon carbide (SiC), zinc oxide (ZnO), or other metal oxide materials. When the substrate 20 is a homo substrate, the substrate 20 can include a gallium nitride (GaN) substrate. The first conductive semiconductor layer 21 can include a single layer or multiple layers having different compositions.

Next, a light emitting layer 23 can be formed on the first conductive semiconductor layer 21. The light emitting layer 23 can include a nitride semiconductor layer. The light emitting layer 23 generates light by combining electrons and holes, which are injected through the first conductive semiconductor layer 21 and a second conductive semiconductor layer 29. The light emitting layer 23 can include a single thin film or multiple thin films based on gallium nitride (GaN). A semiconductor energy band gap of a quantum well where electrons are combined with holes to generate light is lower than an energy band gap of a quantum barrier. The size of the energy band gap can be controlled by adjusting the compositions of the GaN-based thin film applicable to the quantum well and the quantum barrier.

Next, a protective layer 25 can be formed on the light emitting layer 23. The protective layer 25 protects the light emitting layer 23 from chemical or thermal etching and oxidation or contamination when a nano-layer 27 is formed in the subsequent process.

The protective layer 25 can include a nitride semiconductor layer, but the embodiment is not limited thereto. The protective layer 25 can include a single thin film or multiple thin films, which have different compositions, based on GaN. For example, the protective layer 25 can include a GaN-based thin film including aluminum (Al). When the protective layer 25 includes multiple thin films, at least one of the multiple thin films can include the GaN-based thin film including aluminum (Al).

The protective layer 25 can have the thickness of 100 nm or less. As the protective layer 25 has a thin thickness, the interaction between surface plasmons of the nano-layer 27 and excitons of the light emitting layer 23 can be more increased. Accordingly, the internal light emitting efficiency of the light emitting layer 23 can be more increased. In this case, the surface plasmons represent collective wavelike motions of electrons occurring on the surface of a metal thin film.

When the energy of electron-hole pairs (excitons) of the light emitting layer 23 approximates the energy of surface plasmons of metal, the excitons of the light emitting layer 23 strongly interact with the surface plasmons of the metal adjacent to GaN. In this case, the electron-hole pairs of the light emitting layer 23 effectively excite the surface plasmons of the metal, and the excited plasmons effectively emit light.

The strong interaction between the metal surface plasmons and the excitons in the light emitting layer 23 increases the speed of spontaneous combination of the excitons, so that the internal quantum efficiency of the light emitting device is largely increased.

According to the embodiment, the protective layer 25 can have a thickness of 100 nm or less such that the surface plasmons of the nano-layer 27 patterned in a nano-meter size effectively increases the internal quantum efficiency of the light emitting layer 23. If the protective layer 25 has a superior crystalline to effectively protect the light emitting layer 23, the protective layer 25 can have a thickness of 10 nm or less.

According to the embodiment, the second conductive semiconductor layer 29 having a concave-convex surface can be selectively grown from the protective layer 25 under a high temperature by using the nana-layer 27. If the protective layer 25 has a thickness of 5 nm or less, the protective layer 25 can not effectively protect the light emitting layer 23 from thermal or chemical etching.

Then, the nano-layer 27 can be formed on the protective layer 25. The nano-layer 27 can be formed through a metal nano-mask electrically having conductivity, but the embodiment is not limited thereto. The nano-layer 27 can include a metal nano-layer.

For example, the nano-layer 27 can include single metals having conductive electrons, or metal nitride or a metal alloy including at least one of the single metals.

According to the second embodiment, the single metal having conductive electrons can include at least one selected from the group consisting of platinum (Pt), palladium (Pd), chromium (Cr), nickel (Ni), titanium (Ti), tantalum (Ta), tungsten (W), aluminum (Al), silver (Ag), gold (Au), copper (Cu), gallium (Ga), indium (In), iron (Fe), zinc (Zn), tin (Sn), cobalt (Co), ruthenium (Ru), zirconium (Zr), vanadium (V), hafnium (Hf), and molybdenum (Mo).

Materials of the nano-layer 27 can be selected according to wavelengths of light emitted from the light emitting layer 23. According to the second embodiment, the nano-layer 27 can be made at least one selected from the group consisting of platinum (Pt), palladium (Pd), chromium (Cr), nickel (Ni), cobalt (Co), zinc (Zn), gallium (Ga), aluminum (Al), silver (Ag), gold (Au), and copper (Cu) with respect to the wavelengths of ultraviolet and visible rays. In addition, the nano-layer 27 can include a metal alloy or metal nitride including at least one selected from the group consisting of platinum (Pt), palladium (Pd), chromium (Cr), nickel (Ni), cobalt (Co), zinc (Zn), gallium (Ga), aluminum (Al), silver (Ag), gold (Au), and copper (Cu).

The plasmon energy of silver (Ag) is about 3.76 eV. However, when silver (Ag) is adjacent to GaN, the surface plasmon energy becomes about 3 eV. In this case, the energy of 3 eV corresponds to a wavelength of about 410 nm. The surface plasmon energy is determined according to adjacent metal and dielectric constants of dielectric substances.

When gold (Au) is adjacent to GaN, the surface plasmon energy of gold (Au) becomes about 2.2 eV (wavelength of about 560 nm) or less. When aluminum (Al) is adjacent to the GaN, the surface plasmon energy of aluminum (Al) is about 5 eV (wavelength of about 250 nm).

When the light emitting device emits light having a wavelength of about 400 nm or less, the nano-layer 27 can be formed by using at least one of the group consisting of aluminum (Al), a metal alloy including the aluminum (Al), and a metal nitride including the aluminum (Al).

In addition, when the light emitting device emits light having a wavelength band of 400 nm to 500 nm, the nano-layer 27 can be formed by using a metal alloy including silver (Ag) or a metal alloy including silver (Ag). When the light emitting device emits light having a wavelength of 500 nm or more, the nano-layer 27 can be formed using gold (Au) or a metal alloy including the gold (Au).

The nano-layer 27 can be formed in thin film growing equipment or can be formed by performing an additional process at the outside of the thin film growing equipment.

First, in order to form the nano-layer 27 inside the thin film growing equipment, after growing the protective layer 25, a source material of a metal is injected into the thin film growing equipment such that metal particles having a nano-scaled thickness can be formed.

The nano-metal particles can have the size of about 1 nm to about 300 nm. If the size of the metal particles is greater than 300 nm, the area occupied by a high-quality hole injection layer grown in the subsequent process can be reduced. Accordingly, the reliability of the light emitting device can be degraded. If the size of the metal particles is smaller than 1 nm, a concave-convex pattern can not be effectively formed on the surface of the hole injection layer.

If the thin film growing equipment is under a higher temperature, the metal particles represent a hemispherical shape. If the thin film growing equipment is under a lower temperature, the metal particles can have the form of a thin film on the protective layer 24. Such a metal thin film having a nanometer thickness is subject to heat treatment by raising the temperature of the thin film growing equipment, so that the metal thin film can be changed into metal particles having a nano-meter size through heat treatment.

Second, in order to form the nano-layer 27 outside the thin film growing equipment, a process of forming a typical pattern can be performed. In other words, the nano-layer 27 can be formed through a process for forming a dielectric substance pattern and a metal deposition process.

In this case, the nano-layer 27 can have a predetermined pattern. In other words, when a metal thin film having a nano-meter thickness has been deposited on the protective layer 25 through an external metal deposition process, the metal thin film can be changed into metal particles through heat treatment.

According to the second embodiment, the nano-layer 27 can include metal nitride. The metal nitride can be formed through a nitriding process to expose single metal or a metal alloy under a nitrogen atmosphere in the thin film growing equipment. According to the second embodiment, the nitriding process can change a portion of the nano-layer 27 or the entire portion of the nano-layer 27 into the metal nitride.

Subsequently, the second conductive semiconductor layer 29 can be formed on the nano-layer 27. The second conductive semiconductor layer 29 can include a hole injection layer. The second conductive semiconductor layer 29 can be formed on the protective layer 25 exposed between the nano-layers 27.

In this case, a concave-convex pattern can be formed on the upper surface of the second conductive semiconductor layer 29. The concave-convex surface of the second conductive semiconductor layer 29 allows light generated in the light emitting layer 23 from being effectively extracted out of a thin film, so that the light extraction efficiency of the light emitting device can be significantly improved.

The GaN-based hole injection layer can not be deposited on the nano-layer 27. The hole injection layer is primarily formed on the protective layer 25 exposed between the nano-layers 27. When the thickness of the hole injection layer increases beyond the height of metal particles of the nano-layer 27, the hole injection layer is laterally grown with the increase of the thickness. Such a lateral growth of the hole injection layer can cover a portion of or the entire portion of nano-metal particles. In this case, a concave-convex pattern can be formed on the upper surface of the hole injection layer.

Meanwhile, in order to form the concave-convex pattern on the upper surface of the hole injection layer, a dielectric nano-mask including silicon nitride (SiN) or magnesium nitride (MgN) can be employed. Although the concave-convex pattern is formed on the surface of the hole injection layer when such a dielectric nano-mask is employed, the operating voltage of the light emitting device can be increased.

Therefore, according to the embodiment, the concave-convex pattern can be formed on the surface of the hole injection layer by employing a nano-metal mask instead of the dielectric nano-mask. Thus, according to the embodiment, the operating voltage of the light emitting device can be more reduced.

According to the embodiment, the hole injection layer can include metal oxide that has P-type conductivity with an energy band gap greater than the surface plasmon energy of metal. For example, the metal oxide having the P-type conductivity can include P-type zinc oxide (ZnO).

According to the embodiment, in order to uniformly and effectively inject holes, a transparent metal oxide layer can be formed on the hole injection layer having the concave-convex surface. The transparent metal oxide layer can include zinc oxide (ZnO), nickel oxide (NiO), or indium tin oxide (InSnO).

When the transparent conductive metal oxide layer is employed to effectively and uniformly inject holes into the light emitting device without absorbing light emitted from the light emitting layer 23, a nitride semiconductor ohmic layer (not shown) having a thickness of 0.25 nm to 10 nm can be formed on the upper most portion of the hole injection layer having a concave-convex pattern. The nitride semiconductor ohmic layer can include a single layer or multiple layers based on GaN. The nitride semiconductor ohmic layer can include a GaN-based material including indium (In). The nitride semiconductor ohmic layer can include silicon (Si) serving as an N-type dopant and magnesium (Mg) serving as a P-type dopant.

Subsequently, a first electrode 22 can be formed on the first conductive semiconductor layer 21, and a second electrode 24 can be formed on the second conductive semiconductor layer 29.

The light emitting device according to the embodiment employs a patterned nano-layer electrically having conductivity to represent low resistance. In addition, the interaction between the surface plasmons of the patterned nano-layer and the excitons of the light emitting layer 23 can significantly improve internal quantum efficiency.

Therefore, the light emitting device according to the embodiment can efficiently solve problems related to conventional surficial shape control technologies for a P-type GaN thin film, and increase light extraction efficiency while increasing internal quantum efficiency to maximize external quantum efficiency of optical devices, so that a GaN light emitting device having a high intensity can be provided.

Third Embodiment

Figure 3:
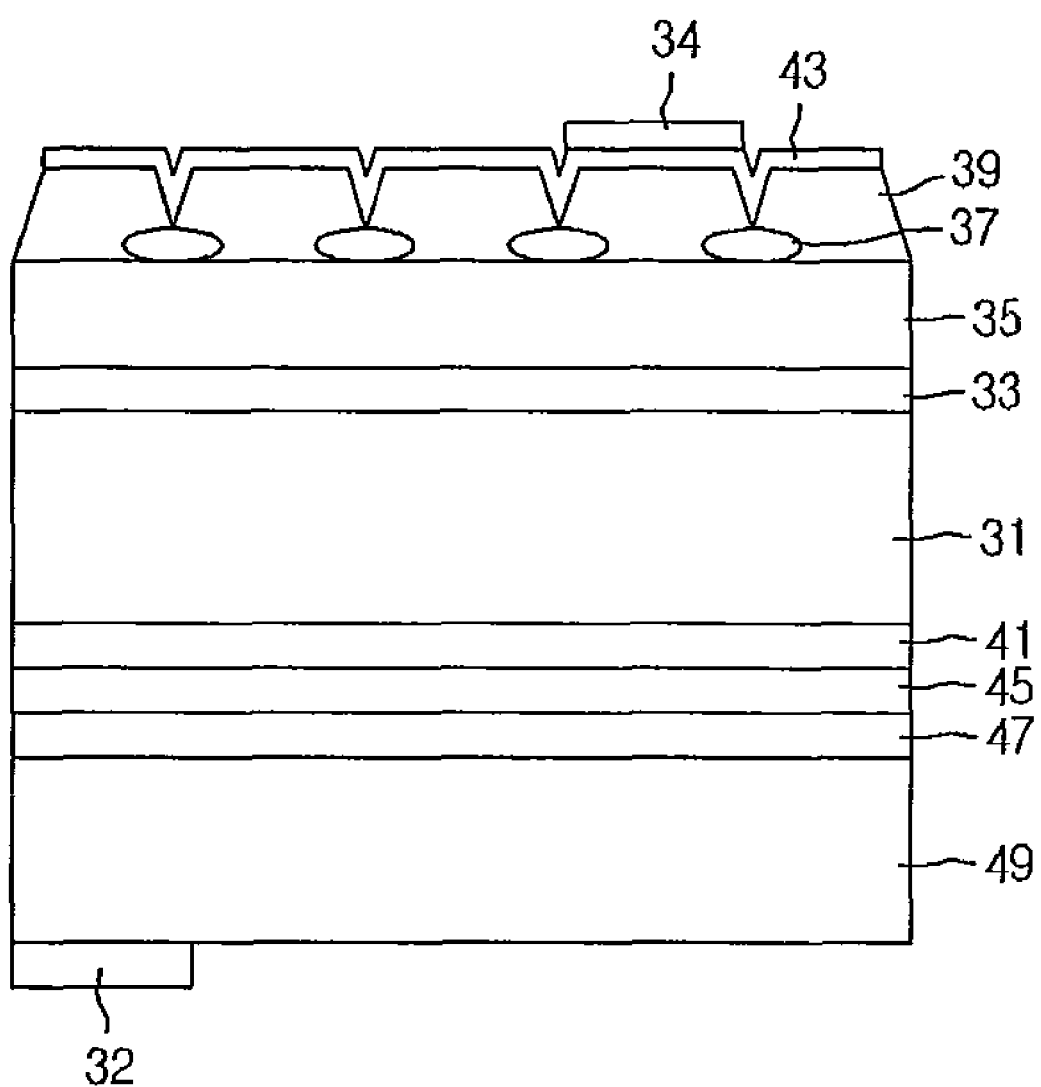
FIG. 3 is a sectional view showing a light emitting device according to a third embodiment.

FIG. 3 is a sectional view showing a light emitting device according to a third embodiment. Particularly, FIG. 3 is a sectional view showing a vertical light emitting device, and the third embodiment is not limited thereto.

Hereinafter, a method for manufacturing the light emitting device according to the third embodiment will be described with reference to FIG. 3. A first conductive semiconductor layer 31 according to the third embodiment can include an N-type semiconductor layer, but the embodiment is not limited thereto.

A metal organic chemical vapor deposition (MOCVD) system can be used to grow a thin film of a nitride semiconductor, but the third embodiment is not limited thereto. A substrate can include sapphire, but the embodiment is not limited thereto. Ammonia can be used as a nitrogen source, and hydrogen (H) and oxygen (O) can be used as carrier gas. Gallium (Ga), indium (In), and aluminum (Al) can be used as a metal organic source. Silicon (Si) can be used as an N-type dopant, and magnesium (Mg) can be used as a P-type dopant, but the embodiment is not limited thereto.

First, a substrate (not shown) is prepared, and the first conductive semiconductor layer 31 can be formed on the substrate. The first conductive semiconductor layer 31 can include an N-type nitride semiconductor electron injection layer, but the embodiment is not limited thereto.

Then, a light emitting layer 33 can be formed on the first conductive semiconductor layer 31. The light emitting layer 33 can include a multi-quantum well structure of indium gallium nitride (InGaN)/gallium nitride (GaN).

Next, a protective layer 35 can be formed on the light emitting layer 33. The protective layer 35 can include a nitride semiconductor layer, but the embodiment is not limited thereto. The protective layer 35 can include a multi-layer of gallium nitride (GaN)/aluminum gallium nitride (AlGaN)/gallium nitride (GaN).

Thereafter, a nano-layer 37 can be formed on the protective layer 35. The nano-layer 37 can include silver (Ag), but the embodiment is not limited thereto. Thereafter, the nano-layer 37 can be subject to heat treatment under a temperature of 800☐ to 900☐.

Next, a second conductive semiconductor layer 39 can be formed on the nano-layer 37. A P-type gallium nitride (GaN) layer having a concave-convex surface can be grown on the second conductive semiconductor layer 39, but the embodiment is not limited thereto. In addition, an indium gallium nitride (InGaN) layer can be formed on the resultant structure to improve an ohmic characteristic. Further, in order to uniformly and easily inject holes, a second transparent layer 43 can be formed on the second conductive semiconductor layer 39.

Next, the substrate can be removed through a laser process. Then, a portion of the surface of the exposed first conductive semiconductor layer 31 can be etched such that the surficial defect can be removed. Then, a first electrode layer can be formed on the first conductive semiconductor layer 31.

The first electrode layer can include at least one of the group consisting of a first transparent layer 41, a reflective layer 45, a combination layer 47, and a second substrate 49.

For example, the first transparent layer 41 can include at least one of the group consisting of ITO, IZO(In—ZnO), GZO(Ga—ZnO), AZO(Al—ZnO), AGZO (Al—Ga ZnO), IGZO(In—Ga ZnO), IrOx, RuOx, RuOx/ITO, Ni/IrOx/Au, and Ni/IrOx/Au/ITO, but the embodiment is not limited thereto.

The reflective layer 45 can include a metal layer including aluminum (Al) or gold (Ag) or alloy of aluminum (A) or gold (Ag). The resultant structure can be combined with the second substrate 49, which serves as a conductive support of silicon (Si) or metal, through the combination layer 47. The combination layer 47 can include eutectic metal. Then, first and second electrode 32 and 34 can be formed on the resultant structure. A second electrode layer can include at least one of the group consisting of a second transparent layer 43 and a second electrode 34.

According to the embodiments, the light emitting device employs nano-particles electrically having conductivity to represent low resistant. In addition, the interaction between the surface plasmons of the nano-mask and the excitons can significantly improve internal quantum efficiency. According to the embodiments, the light emitting device increases internal quantum efficiency while increasing light extraction efficiency, thereby maximizing external quantum efficiency of optical devices.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device, comprising:
a first conductive semiconductor layer;
a light emitting layer on the first conductive semiconductor layer;
another layer on the light emitting layer;
nano-particles on a top surface of the another layer; and
a second conductive semiconductor layer on the top surface of the another layer between the nano-particles, wherein a top surface of the second conductive semiconductive layer includes recesses corresponding to the nano-particles.

2. The light emitting device of claim 1, wherein the another layer comprises a nitride semiconductor layer.

3. The light emitting device of claim 1, wherein the another layer comprises a gallium nitride (GaN)-based thin film including aluminum (Al).

4. The light emitting device of claim 1, wherein the another layer has a thickness of 5 nm to 100 nm.

5. The light emitting device of claim 1, wherein the nano-particles include one of a substantially pure metal, a metal alloy including the substantially pure metal, and a metal nitride including the substantially pure metal.

6. The light emitting device of claim 5, wherein the substantially pure metal comprises at least one of platinum (Pt), palladium (Pd), chromium (Cr), nickel (Ni), titanium (Ti), tantalum (Ta), tungsten (W), aluminum (Al), silver (Ag), gold (Au), copper (Cu), gallium (Ga), indium (In), iron (Fe), zinc (Zn), tin (Sn), cobalt (Co), ruthenium (Ru), zirconium (Zr), vanadium (V), hafnium (Hf), and molybdenum (Mo).

7. The light emitting device of claim 1, wherein the nano-particles comprises metal particles having a size of 1 nm to 300 nm.

8. The light emitting device of claim 1,
wherein the nano-particles comprises at least one of aluminum (Al), a metal alloy including aluminum (Al), and a metal nitride including aluminum (Al), and
wherein the light emitting device is configured to emit light having a wavelength of 400 nm or less.

9. The light emitting device of claim 1,
wherein the nano-particles include silver (Ag) or a metal alloy including silver (Ag), and
wherein the light emitting device is configured to emit light having a wavelength band of 400 nm to 500 nm.

10. The light emitting device of claim 1,
wherein the nano-particles include gold (Au) or a metal alloy including gold (Au), and
wherein the light emitting device is configured to emit light having a wavelength of 500 nm or more.

11. The light emitting device of claim 1, wherein the second conductive semiconductor layer is in contact with the another layer in a region in which the nano-particles are not formed.

12. The light emitting device of claim 1, wherein the nano-particles are formed in a predetermined pattern.

13. The light emitting device of claim 1, wherein the first conductive semiconductor layer comprises an electron injection layer, and the second conductive semiconductor layer comprises a hole injection layer.

14. The light emitting device of claim 1, wherein the first conductive semiconductor layer comprises a hole injection layer, and the second conductive semiconductor layer comprises an electron injection layer.

15. The light emitting device of claim 1, further comprising:
a first electrode layer below the first conductive semiconductor layer.

16. The light emitting device of claim 1, wherein the second conductive semiconductor layer covers at least a portion of the nano-particles.

17. The light emitting device of claim 1, wherein an uppermost surface of the nano-particles are not covered by the second conductive semiconductor layer.

18. The light emitting device of claim 1, wherein a depth of the another layer is configured to protect the active layer from interactions with the nano-particles.

19. A light emitting device, comprising:
a first electrode layer;
a first conductive semiconductor layer on the first electrode layer;
a light emitting layer on the first conductive semiconductor layer;
another layer on the light emitting layer;
nano-particles on a top surface of the another layer;
a second conductive semiconductor layer on the top surface of the another layer between the nano-particles; and
a second electrode layer on the second conductive semiconductor layer,
wherein a top surface of the second conductive semiconductive layer includes recesses corresponding to the nano-particles.

20. The light emitting device of claim 19, wherein the first electrode layer comprises at least one of a first transparent layer, a reflective layer, a combination layer, and a second substrate.

21. The light emitting device of claim 19, wherein the second electrode layer comprises at least one of a second transparent layer and a second electrode.

22. The light emitting device of claim 19, wherein the second conductive semiconductor layer covers at least a portion of the nano-particles.

23. The light emitting device of claim 19, wherein an uppermost surface of the nano-particles are not covered by the second conductive semiconductor layer.

24. The light emitting device of claim 19, wherein a depth of the another layer is configured to protect the active layer from interactions with the nano-particles.

* * * * *